(12) United States Patent
Malladi et al.

(10) Patent No.: US 8,603,885 B2
(45) Date of Patent: Dec. 10, 2013

(54) FLAT RESPONSE DEVICE STRUCTURES FOR BIPOLAR JUNCTION TRANSISTORS

(75) Inventors: Ramana M. Malladi, Williston, VT (US); Kim M. Newton, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 282 days.

(21) Appl. No.: 12/984,359

(22) Filed: Jan. 4, 2011

(65) Prior Publication Data
US 2012/0168907 A1 Jul. 5, 2012

(51) Int. Cl.
*H01L 21/331* (2006.01)

(52) U.S. Cl.
USPC .... 438/338; 438/323; 438/340; 257/E21.381; 257/E21.382

(58) Field of Classification Search
USPC .......... 438/322, 323, 338, 340; 257/E21.381, 257/E21.382, E21.383
See application file for complete search history.

(56) References Cited

U.S. PATENT DOCUMENTS

| | | |
|---|---|---|
| 5,258,644 A | 11/1993 | Tamba et al. |
| 5,387,553 A | 2/1995 | Moksvold et al. |
| 5,448,087 A | 9/1995 | Streit et al. |
| 5,500,554 A | 3/1996 | Sato |
| 5,530,273 A | 6/1996 | Nakamura |
| 5,656,514 A | 8/1997 | Ahlgren et al. |
| 5,668,022 A | 9/1997 | Cho et al. |
| 5,668,396 A | 9/1997 | Sato |
| 5,786,622 A | 7/1998 | Ronkainen |
| 5,814,843 A | 9/1998 | Ohkubo |
| 5,930,636 A | 7/1999 | Oki et al. |
| 5,955,775 A | 9/1999 | Miwa |
| 5,962,880 A | 10/1999 | Oda et al. |
| 6,265,276 B1 | 7/2001 | Miwa |
| 6,271,070 B2 | 8/2001 | Kotani et al. |
| 6,333,237 B1 | 12/2001 | Yoshida |
| 6,365,957 B1 | 4/2002 | Miyakawa |
| 6,462,397 B2 | 10/2002 | Ryum et al. |
| 6,472,288 B2 * | 10/2002 | Freeman et al. ............... 438/369 |
| 6,541,346 B2 | 4/2003 | Malik |
| 6,720,625 B2 | 4/2004 | Yu |
| 6,809,024 B1 | 10/2004 | Dunn et al. |
| 6,858,485 B2 | 2/2005 | Freeman et al. |
| 6,869,852 B1 | 3/2005 | Joseph et al. |
| 6,894,362 B2 | 5/2005 | Malik |
| 6,906,401 B2 | 6/2005 | Dunn et al. |
| 6,940,149 B1 | 9/2005 | Divakaruni et al. |
| 7,002,221 B2 | 2/2006 | Khater et al. |
| 7,038,256 B1 | 5/2006 | Sawdai et al. |
| 7,038,298 B2 | 5/2006 | Joseph et al. |
| 7,067,898 B1 | 6/2006 | Thomas, III et al. |
| 7,087,940 B2 | 8/2006 | Khater et al. |
| 7,088,189 B2 | 8/2006 | Rohde et al. |
| 7,091,082 B2 | 8/2006 | Feng et al. |

(Continued)

*Primary Examiner* — Matthew E Warren
(74) *Attorney, Agent, or Firm* — Wood, Herron & Evans LLP; Anthony J. Canale

(57) ABSTRACT

Bipolar transistors with tailored response curves, as well as fabrication methods for bipolar transistors and design structures for BiCMOS integrated circuits. The bipolar transistor includes a first section of a collector region implanted with a first dopant concentration and a second section of the collector region implanted with a second dopant concentration that is higher than the first dopant concentration. A first emitter is formed in vertical alignment with the first section of the collector region. A second emitter is formed in vertical alignment with the second section of the collector region.

17 Claims, 14 Drawing Sheets

(56) References Cited

U.S. PATENT DOCUMENTS

| | | |
|---|---|---|
| 7,132,344 B1 | 11/2006 | Knorr |
| 7,180,381 B2 | 2/2007 | Rohde et al. |
| 7,196,591 B2 | 3/2007 | Rohde et al. |
| 7,205,188 B2 | 4/2007 | Knoll et al. |
| 7,217,988 B2 | 5/2007 | Ahlgren et al. |
| 7,238,565 B2 | 7/2007 | Guarin et al. |
| 7,253,096 B2 | 8/2007 | Khater et al. |
| 7,265,642 B2 | 9/2007 | Rohde et al. |
| 7,286,583 B2 | 10/2007 | Feng et al. |
| 2008/0023794 A1 | 1/2008 | Prechtl et al. |
| 2009/0085066 A1* | 4/2009 | Preisler .................. 257/197 |

* cited by examiner

FLAT RESPONSE DEVICE STRUCTURES FOR BIPOLAR JUNCTION TRANSISTORS

BACKGROUND

The invention relates generally to semiconductor device fabrication and, in particular, to device structures for bipolar junction transistors, as well as fabrication methods for such device structures and design structures for BiCMOS integrated circuits.

Bipolar junction transistors are typically found in demanding types of analog circuits, especially analog circuits used in high-frequency applications. Bipolar junction transistors are found in radiofrequency integrated circuits (RFICs) used in wireless communications systems, as well as integrated circuits requiring high power efficiency, such as power amplifiers in cellular telephones, and other types of high speed integrated circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Conventional bipolar junction transistors include three adjacent doped semiconductor layers or regions. A central region forms a base and two end regions form an emitter and a collector. A bipolar junction transistor includes a pair of p-n junctions, namely an emitter-base junction and a collector-base junction. In operation, the emitter/base junction is forward biased and the collector/base junction is reverse biased. Generally, a bipolar junction transistor can be operated as an amplifier or as a switch.

Improved device structures are needed for bipolar junction transistors that boost device performance, as well as improved fabrication methods for these device structures and design structures for BiCMOS integrated circuits.

BRIEF SUMMARY

In an embodiment of the invention, a method is provided for fabricating a device structure. The method comprises implanting a first section of a collector region with a first dopant concentration and implanting a second section of the collector region with a second dopant concentration higher than the first dopant concentration. The method further includes forming a first emitter in vertical alignment with the first section of the collector region and forming a second emitter in vertical alignment with the second section of the collector region.

In an embodiment of the invention, a device structure comprises an intrinsic base, a collector region in a semiconductor layer, a first emitter in a contacting relationship with the intrinsic base, and a second emitter in a contacting relationship with the intrinsic base. A first section of the collector region has a first dopant concentration and a second section of the collector region has a second dopant concentration higher than the first dopant concentration. The first emitter is vertically aligned with the first section of the collector region. The second emitter is vertically aligned with the second section of the collector region.

In another embodiment, a hardware description language (HDL) design structure is encoded on a machine-readable data storage medium. The HDL design structure comprises elements that, when processed in a computer-aided design system, generates a machine-executable representation of a device structure for a bipolar junction transistor. The HDL design structure comprises an intrinsic base, a collector region in a semiconductor layer, a first emitter in a contacting relationship with the intrinsic base, and a second emitter in a contacting relationship with the intrinsic base. A first section of the collector region has a first dopant concentration and a second section of the collector region has a second dopant concentration higher than the first dopant concentration. The first emitter is vertically aligned with the first section of the collector region. The second emitter is vertically aligned with the second section of the collector region. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
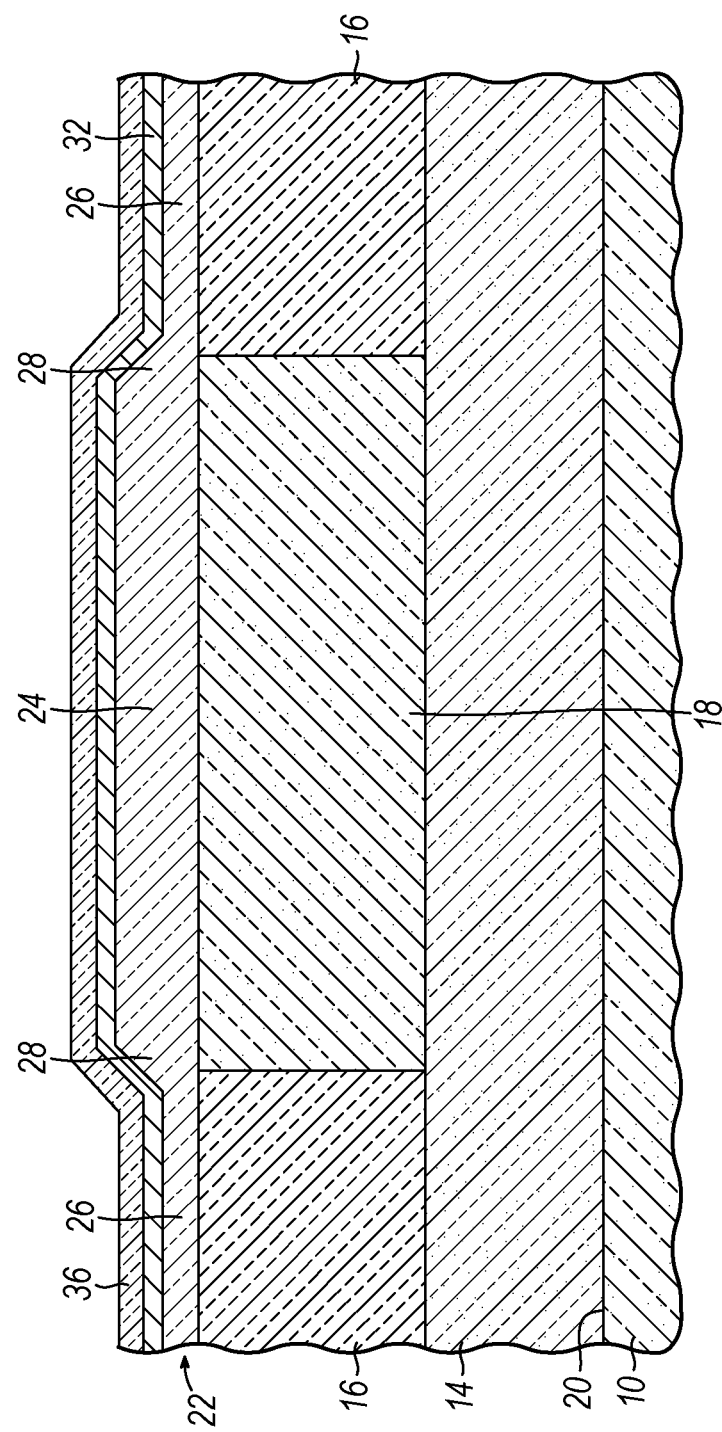
FIGS. 1-7 are cross-sectional views of a portion of a substrate at successive fabrication stages of a processing method for fabricating a device structure in accordance with an embodiment of the invention.

With reference to FIG. 1 and in accordance with an embodiment of the invention, a semiconductor layer 10 is comprised of a semiconductor material. Semiconductor layer 10 may be any suitable bulk substrate containing a semiconductor material that a person having ordinary skill in the art would recognize as suitable for forming an integrated circuit. For example, semiconductor layer 10 may be comprised of a monocrystalline silicon-containing material, such as single crystal silicon with a (100) crystal lattice orientation, and may include an epitaxial layer. The monocrystalline semiconductor material contained in the semiconductor layer 10 may contain a definite defect concentration and still be considered single crystal. The semiconductor material constituting semiconductor layer 10 may be lightly doped with an impurity to alter its electrical properties. Specifically, the semiconductor layer 10 may be lightly doped with a p-type impurity species, such boron, to render it initially p-type.

A subcollector 14 of a device structure 65 (FIGS. 7, 7A) is defined as an impurity-doped region in the semiconductor layer 10. The subcollector 14 may be doped with a concentration of an electrically-active dopant, such as an n-type impurity species from Group V of the Periodic Table (e.g., arsenic (As), phosphorus (P), or antimony (Sb)) effective to impart an n-type conductivity in which electrons are the majority carriers and dominate the electrical conductivity of the semiconductor material. The subcollector 14 may be formed by ion implantation of an n-type dopant and annealing to activate the dopant using techniques and conditions familiar to one skilled in the art.

Figure 7:
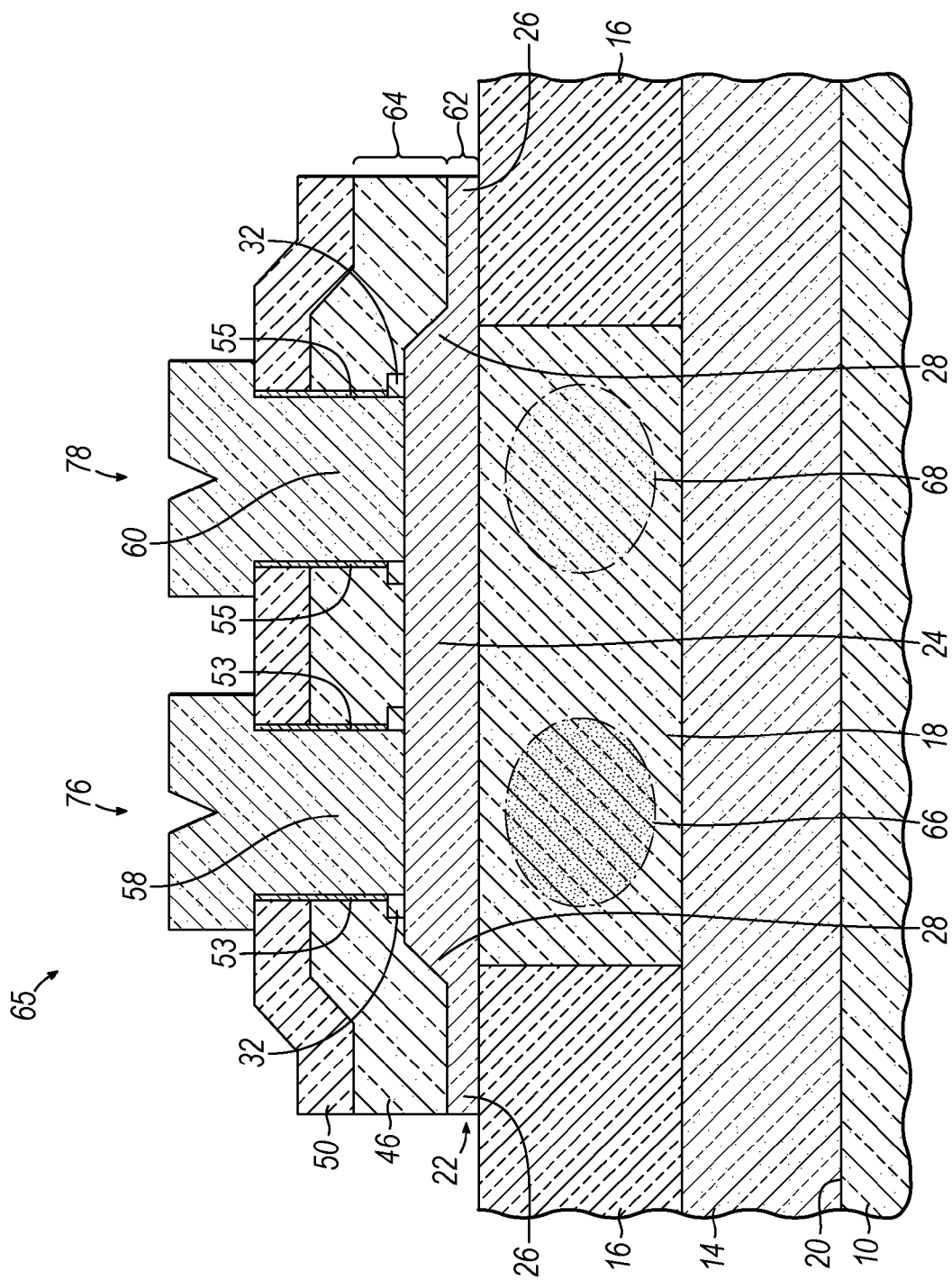
Figure 7A:
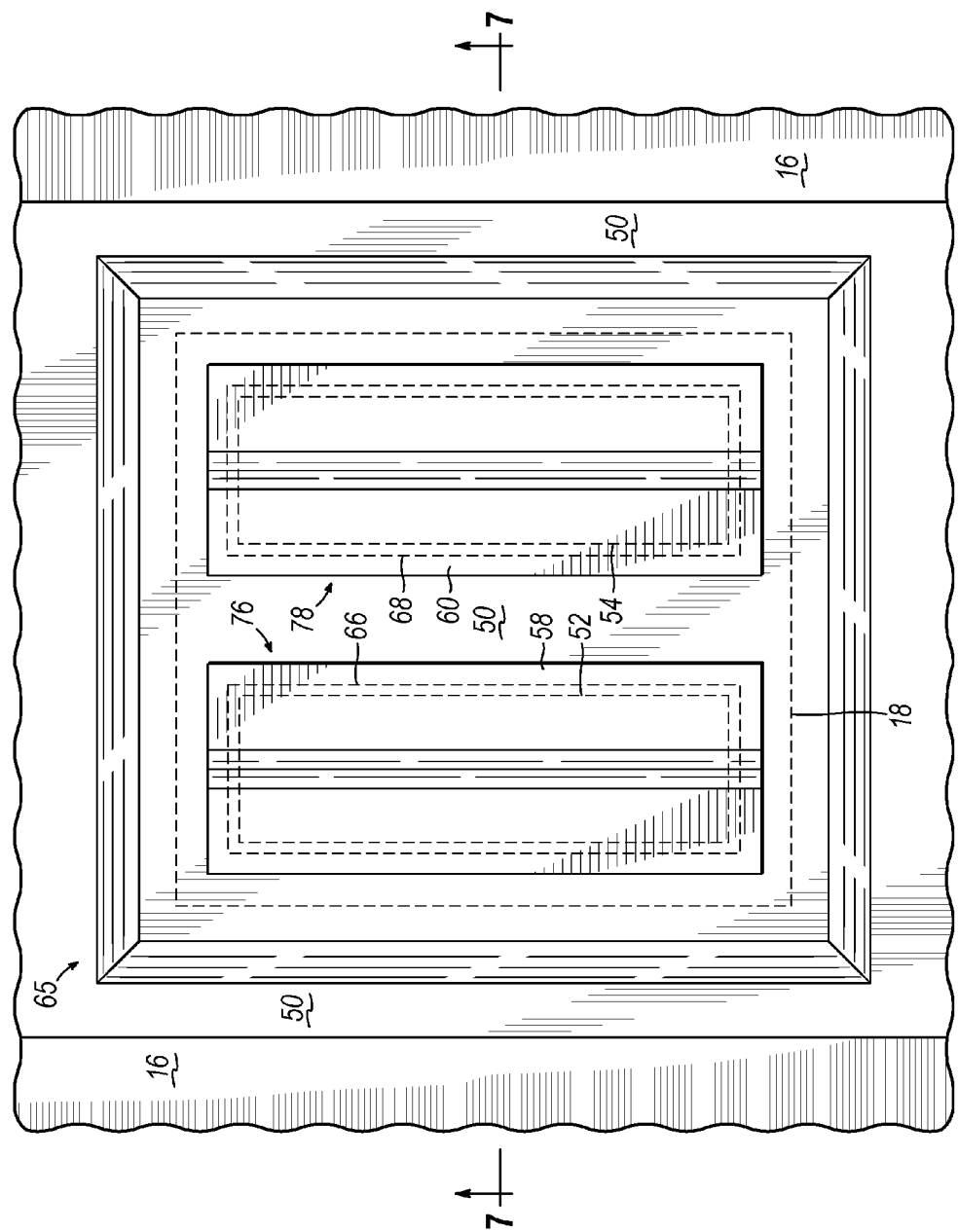
FIG. 7A is a top view of the substrate portion at the fabrication stage of FIG. 7.

Trench isolation regions 16 are formed by a conventional process in the semiconductor layer 10. In one embodiment, the trench isolation regions 16 may be formed by a shallow trench isolation (STI) technique that relies on a lithography and dry etching process to define closed-bottomed trenches in semiconductor layer 10, fills the trenches with dielectric, and planarizes the layer to a top surface 20 of the semiconductor layer 10 using a chemical mechanical polishing (CMP) process. The CMP process combines abrasion and dissolution to remove excess dielectric from the top surface 20 of semiconductor layer 10. The dielectric may be an oxide of silicon, such as densified tetraethylorthosilicate (TEOS) deposited by thermal chemical vapor deposition (THCVD) or a high-density plasma (HDP) oxide deposited with plasma assistance. The trench isolation regions 16 circumscribe and electrically isolate a device region of the semiconductor layer 10 that is used to form a collector region 18 of the device structure 65 (FIGS. 7, 7A).

A layer 22, which is comprised of a material suitable for forming an intrinsic base 62 of the device structure 65 (FIGS. 7, 7A), is deposited on the top surface 20 of the semiconductor layer 10 and, in particular on the collector region 18 of the semiconductor layer 10. Layer 22 may be formed using a low temperature epitaxial (LTE) growth process (typically at a growth temperature ranging from 450° C. to 850° C.). Layer 22 may contain a semiconductor material comprised of silicon (Si) and germanium (Ge) in a $Si_xGe_{1-x}$ alloy having a germanium content in a range between about 5 atomic percent and about 50 atomic percent. The germanium content of the layer 22 may be uniform or the germanium content of layer 22 may be graded or stepped across the thickness of layer 22.

Layer 22 includes a raised region 24 laterally positioned in vertical alignment with the collector region 18 of the semiconductor layer 10, a field region 26 encircling the raised region 24 and overlying the trench isolation regions 16, and a facet region 28 connecting the raised region 24 and field region 26. Layer 22 is monocrystalline in the raised region 24, polycrystalline in the field region 26, and either a mixture of polycrystalline and monocrystalline in facet region 28 or primarily monocrystalline in facet region 28. The thickness of the layer 22 may range from about 10 nm to about 600 nm with the largest layer thickness in the raised region 24. As the thickness of layer 22 increases, the width of the raised region 24 likewise increases so that the facet region 28 moves laterally outward relative to the centerline of the raised region 24.

With continued reference to FIG. 1, a layer 32, which contains a material with a different composition than layer 22, is deposited on a top surface of layer 22. Layer 32 may directly contact the top surface of layer 22. Layer 32 may be comprised of a dielectric, which is an insulating material having a lesser degree of electrical conduction and a higher dielectric constant than layer 22. Layer 32 may be a high temperature oxide (HTO) deposited using low pressure chemical vapor deposition (LPCVD) at temperatures of 500° C. or higher, and may be comprised of an oxidized silicon, such as stoichiometric silicon dioxide ($SiO_2$). Alternatively, layer 32 may be deposited or grown by another suitable process. The physical layer thickness of layer 32 may be on the order of about 15 nm.

A layer 36, which contains a material with a different composition than layer 32, is deposited on a top surface of layer 32. Layer 36 may directly contact the top surface of layer 32. Layer 36 may be comprised of a dielectric with a different dielectric constant than layer 32 and different etching selectivity. In one embodiment, layer 36 may be comprised of silicon nitride ($Si_3N_4$) deposited using LPCVD or rapid-thermal chemical vapor deposition (RTCVD). Alternatively, layer 36 may be deposited by another suitable process. The physical layer thickness of layer 36 may be on the order of about 15 nm.

Figure 2:
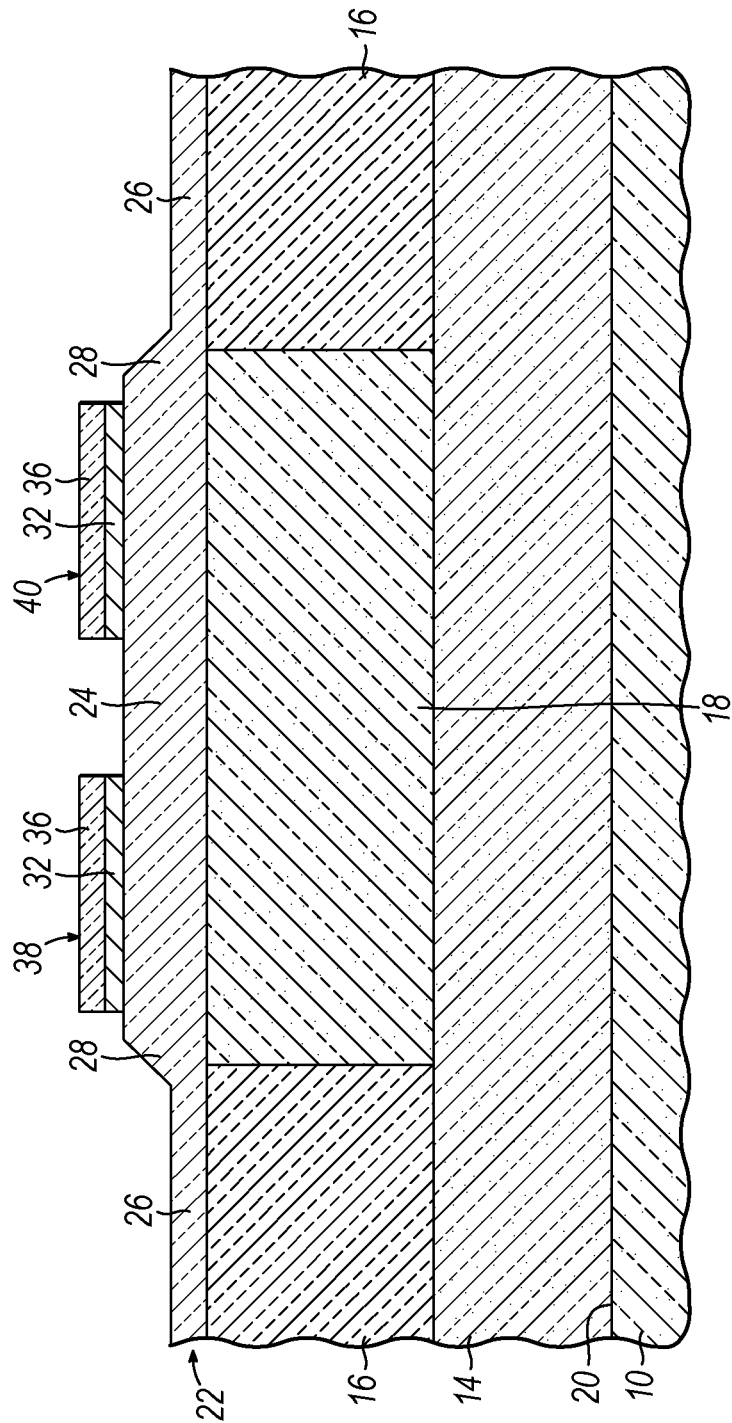

With reference to FIG. 2 in which like reference numerals refer to like features in FIG. 1 and at a subsequent fabrication stage, the layer stack consisting of layers 32, 36 is patterned using photolithography and subtractive etching processes to define landing pads, generally indicated by reference numerals 38, 40. To that end, the layer stack consisting of layers 32, 36 is masked with a patterned mask layer (not shown). In one embodiment, the mask layer may be a photoresist layer comprised of a sacrificial organic material applied to the top surface of layer 32 by spin coating. The photolithography process entails exposing the photoresist layer to radiation imaged through a photomask and developing the resultant latent feature pattern in the exposed resist to define residual areas of photoresist that mask portions of layers 32, 36. A subtractive etching process, such as a reactive-ion etching (RIE) process or a wet chemical etching process, is used to remove regions of layers 32, 36 not protected by the mask layer. An initial segment of the etching process removes the unprotected regions of layer 36 and stops on the material of layer 32 and then the etch chemistry is changed to remove the unprotected regions of the underlying layer 32. At the conclusion of the subtractive etching process, the top surface of layer 22 is exposed aside from portions covered by the landing pads 38, 40.

Figure 3:
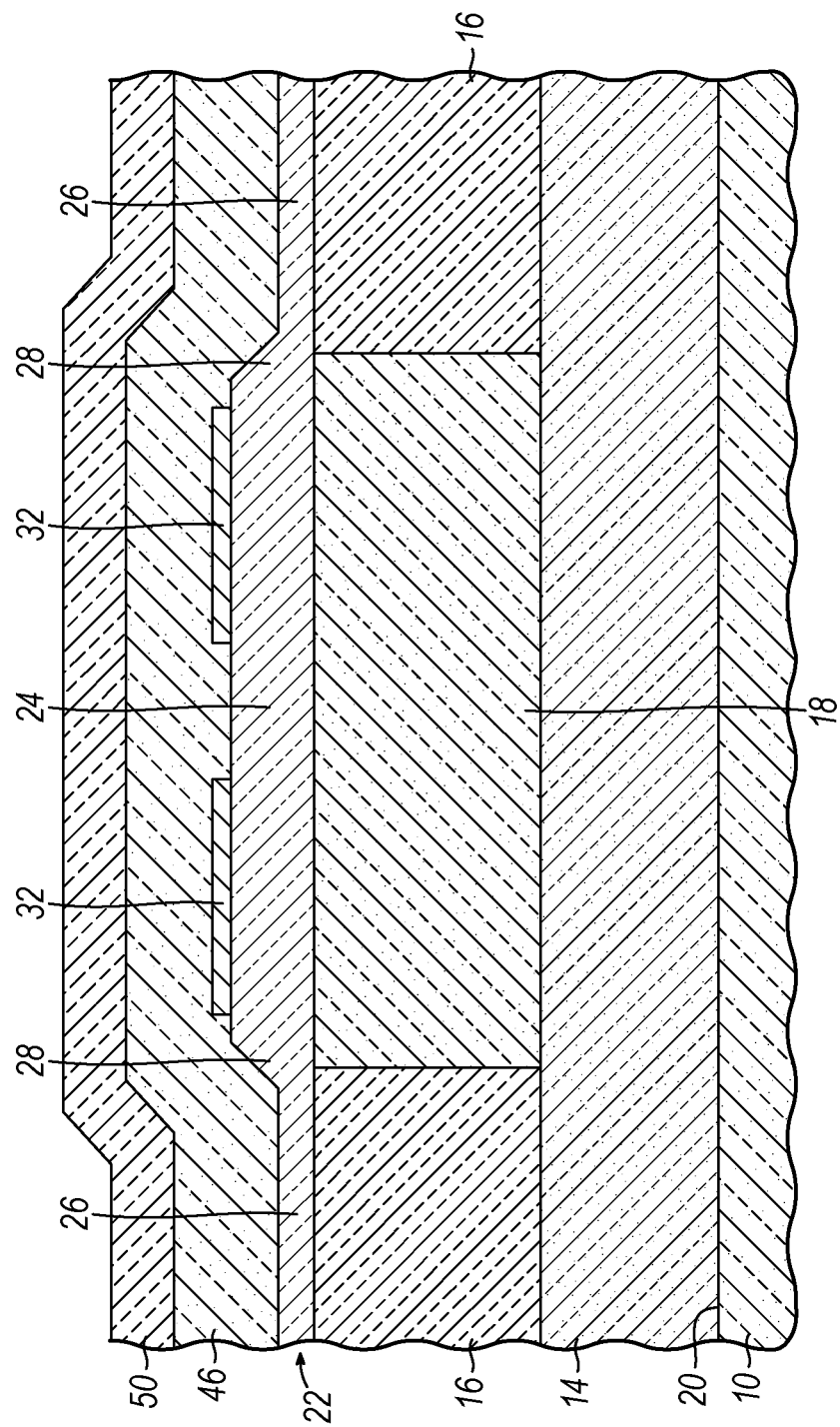

With reference to FIG. 3 in which like reference numerals refer to like features in FIG. 2 and at a subsequent fabrication stage, the upper layer 36 in each of the landing pads 38, 40 is removed to expose the lower layer 32. The removal of layer 36 from landing pads 38, 40 may be performed using a reactive ion etching (RIE) process or a hot phosphoric acid etch.

A layer 46 comprised of a conductive material suitable to participate in forming an extrinsic base 64 of the device structure 65 (FIGS. 7, 7A) is deposited on a top surface of extrinsic base layer 22. In one embodiment, the semiconductor material of layer 46 may be a single layer comprised of polycrystalline silicon (e.g., polysilicon) deposited by a conventional deposition process and doped to have an enhanced electrical conductivity. Layer 46 may be in-situ doped during deposition with a concentration of an electrically-active dopant, such as a p-type impurity species from Group III of the Periodic Table (e.g., boron (B), aluminum (Al), or gallium (Ga)) effective to impart a p-type conductivity in which holes are the majority carriers and dominate the electrical conductivity of the constituent semiconductor material. Alternatively, layer 46 may be comprised of n-type semiconductor material formed by implanting an electrically-active n-type dopant, such as an impurity species from Group V of the Periodic Table (e.g., As, P, or Sb) effective to impart n-type conductivity.

A non-conductive insulating layer 50 is applied as a dielectric material to a top surface of layer 46 containing the conductive material. The insulating layer 50 may be an isolation oxide comprised of a dense $SiO_2$ deposited by a conventional deposition process, such as THCVD using TEOS as a reactant, and may have a thickness after formation of about 150 nm.

Figure 4:
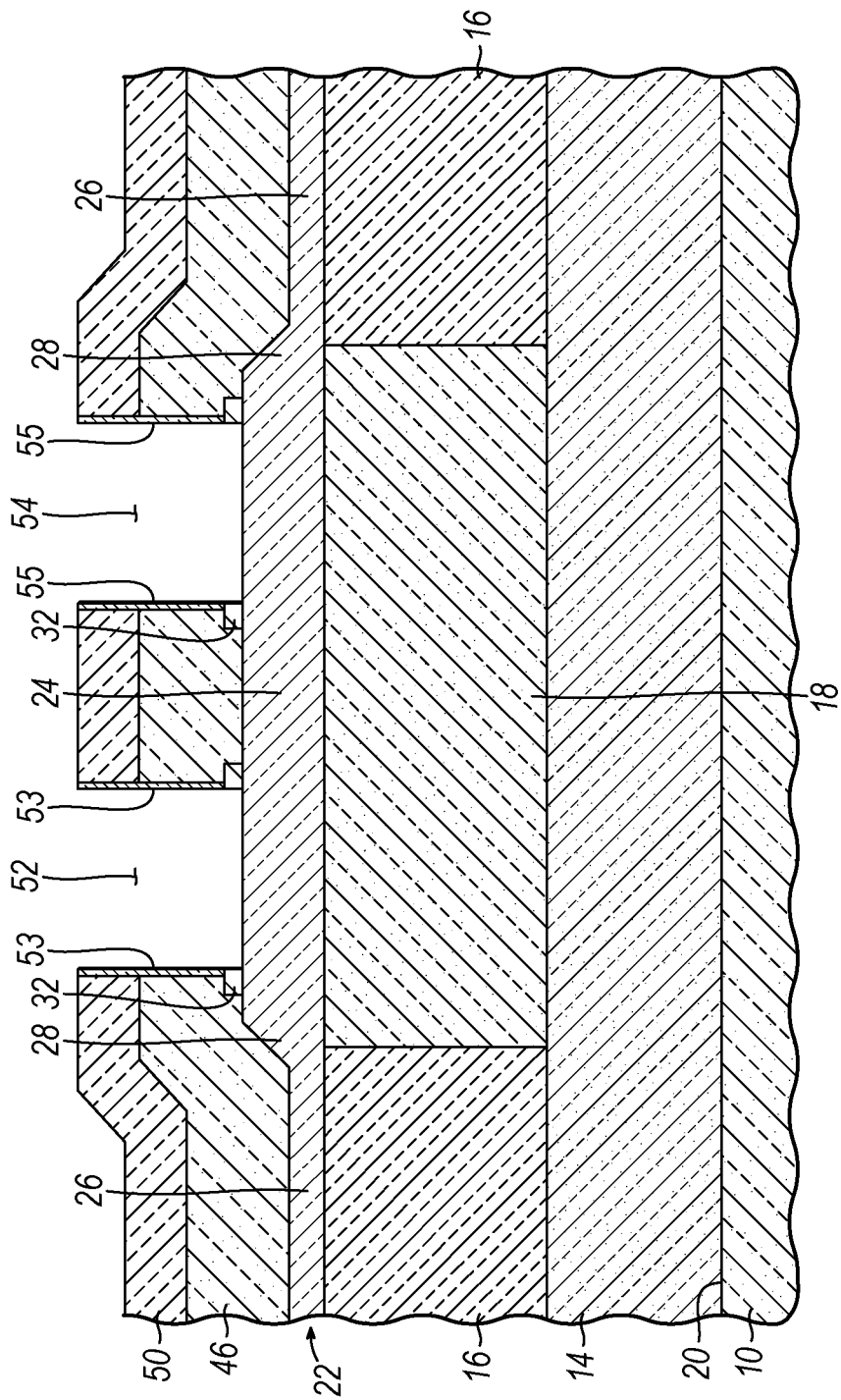
Figure 4A:
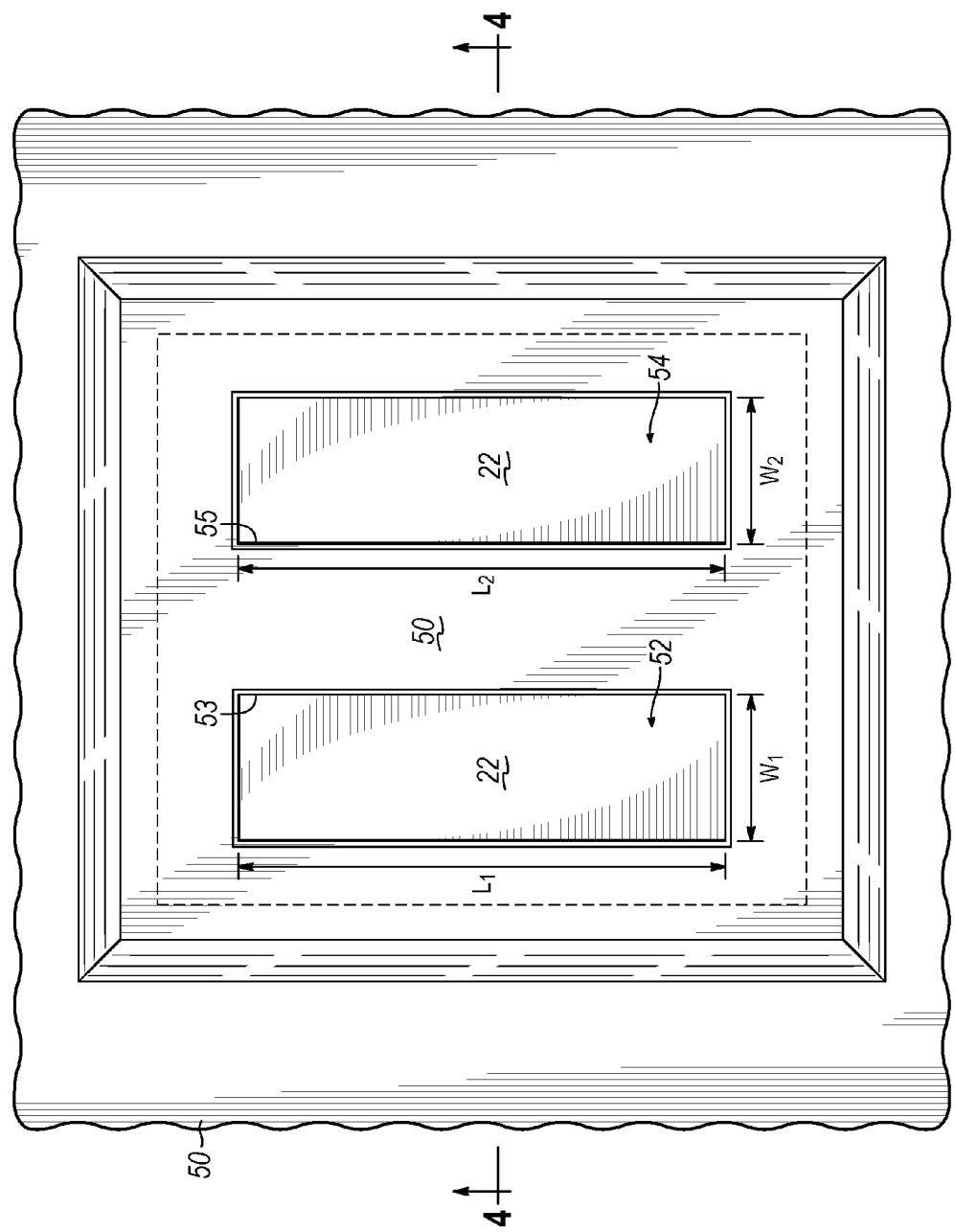
FIG. 4A is a top view of the substrate portion at the fabrication stage of FIG. 4.

With reference to FIGS. 4, 4A in which like reference numerals refer to like features in FIG. 3 and at a subsequent fabrication stage, layers 32, 46, 50 are patterned using photolithography and subtractive etching processes to define emitter windows 52, 54 as openings that extend to the depth of, and land on, the residual portion of each landing pad defined by layer 32. A two-step subtractive etching process is used that has a chemistry that is effective to etch the material of layer 50 and then different chemistries that are effective to etch the materials of layers 46. The latter portion of the etching process stops on the material of layer 32. Emitter window 54 is shorter than the emitter window 52 such that, when the emitters are formed, the device geometries differ.

Spacers 53, 55 are formed on the sidewalls of the portions of layers 32, 46, 50 that border the emitter windows 52, 54. In a representative embodiment, the spacers 53, 55 are formed from a non-conductive, dielectric material that is shaped by a directional anisotropic etching process, such as a RIE process, to preferentially remove the dielectric material from horizontal surfaces. The dielectric material used to form the spacers 53, 55 may be a thin layer of $Si_3N_4$ deposited by a CVD process or a bilayer consisting of thin discrete layers of $Si_3N_4$ and $SiO_2$ also deposited by CVD. An etching process, such as chemical oxide removal (COR), that stops on layer 22 is used to remove the material of layer 32 exposed by the emitter windows 52, 54. Residual portions of layer 32, which are protected by the spacers 53, 55, remain after of the etching process near the base of the emitter windows 52, 54.

The emitter window 52 has a geometry with a given length, $L_1$, and width, $W_1$, and the emitter window 54 is characterized by a geometry with a given length, $L_2$, and width, $W_2$. In the representative embodiment, the emitter windows 52, 54 have equal lengths and widths. However, the embodiments of the invention are not so limited as the lengths and/or widths of the emitter windows 52, 54 may be adjusted to tailor the response curve of cut-off frequency as a function of collector current.

Figure 5:
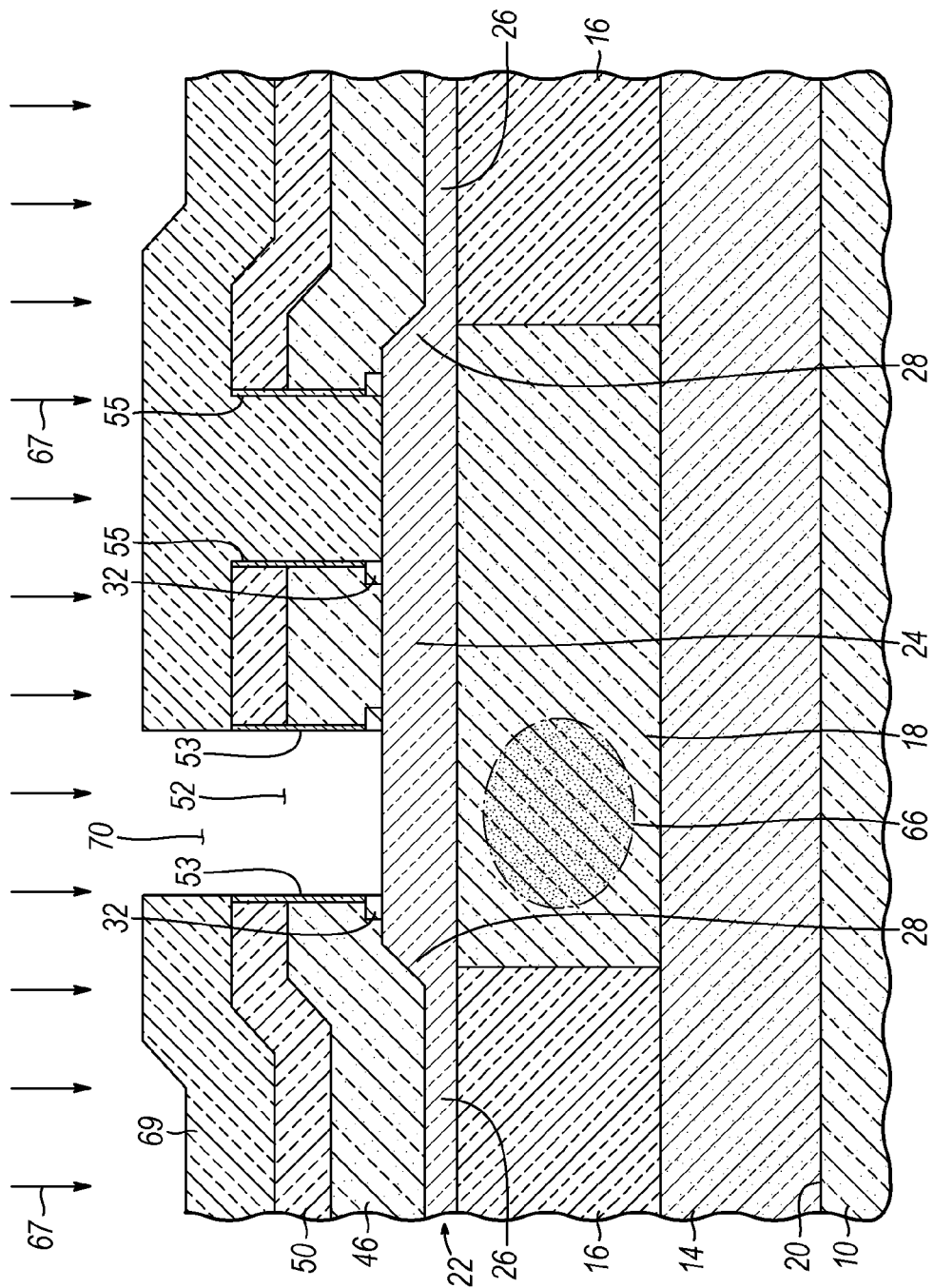

With reference to FIG. 5 in which like reference numerals refer to like features in FIGS. 4, 4A and at a subsequent fabrication stage, a collector section 66 is formed in the collector region 18 of the semiconductor layer 10. Specifically, the collector section 66 comprises a selectively implanted collector (SIC) formed in the collector region 18 by implanting a dopant with a selected dose and/or kinetic energy into a selected volume of the semiconductor material of the semiconductor layer 10.

An ion-implantation mask 69 is applied that overlaps with the emitter window 52 and is patterned with a window 70 that exposes the emitter window 52. The ion-implantation mask 69 may be formed of a resist layer that is applied and photolithographically patterned in a conventional manner. Ions, as indicated by the single-headed arrows 67, are implanted into the semiconductor material of the collector region 18 to form the collector section 66. The thickness and stopping power of the ion-implantation mask 69 are selected to provide the needed stopping of ions 67 outside of the window 70. The collector section 66 is shallower in depth than the subcollector 14 and disposed in the collector region 18 at a depth between the subcollector 14 and layer 22. The emitter window 52 self-aligns the implanted ions 67 with the desired location for the collector section 66 in the collector region 18. After ion implantation, the ion-implantation mask 69 is removed by, for example, oxygen plasma ashing or solvent stripping.

Figure 6:
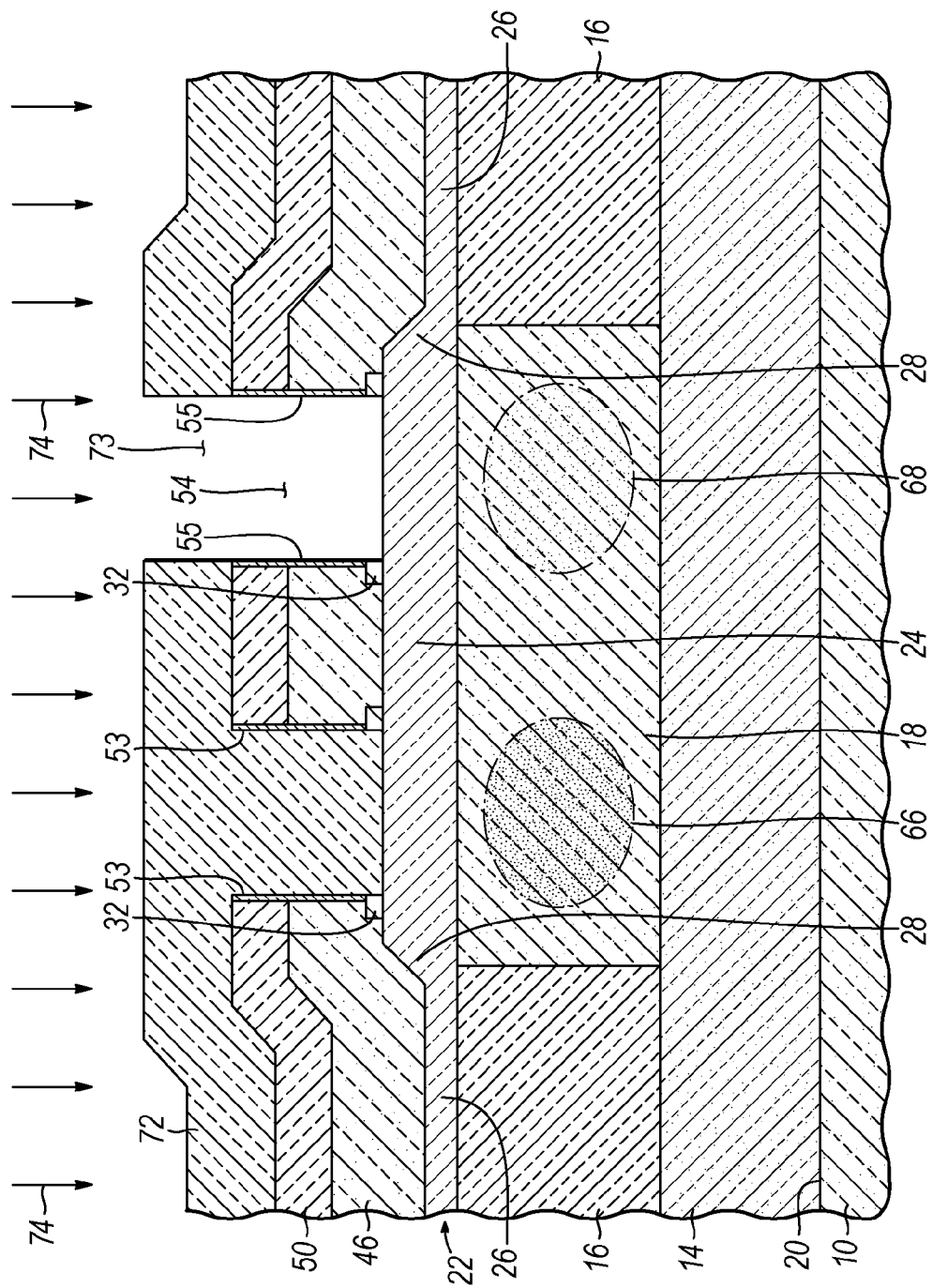

With reference to FIG. 6 in which like reference numerals refer to like features in FIG. 5 and at a subsequent fabrication stage, a collector section 68 is formed in the collector region 18 of the semiconductor layer 10. Specifically, the collector section 68 comprises a selectively implanted collector (SIC) formed in the collector region 18 by implanting a dopant with a selected dose and/or kinetic energy into a selected volume of the semiconductor material of the semiconductor layer 10. The collector section 68 is juxtaposed with the collector section 66 in a side-by-side arrangement in which the sections 66, 68 are located within approximately the same depth range.

The concentration of the implanted dopant in the collector section 68 is lower than the concentration of the implanted dopant in the collector section 66 so that the collector section 68 has a lower electrical conductivity. The increased concentration may be realized by implanting a higher dose of the dopant into collector section 68 than into collector section 66 at the same kinetic energy. The semiconductor material in the collector sections 66, 68 may have a concentration ranging from $1\times10^{15}$ $cm^{-3}$ to $1\times10^{19}$ $cm^{-3}$ with the dopant concentration in the collector section 66 being higher than the dopant concentration in the collector section 68. In one embodiment, the dopant concentration in the collector section 66 is at least an order of magnitude higher than the dopant concentration in the collector section 68.

An ion-implantation mask 72 is applied that overlaps with the emitter window 54 and is patterned with a window 73 that exposes the emitter window 54. The ion-implantation mask 72 may be formed of a resist layer that is applied and photolithographically patterned in a conventional manner. Ions, as indicated by the single-headed arrows 74, are implanted into the semiconductor material of the collector region 18 to form the collector section 68. The thickness and stopping power of the ion-implantation mask 72 are selected to provide the needed stopping of ions 74 outside of the window 73. The collector section 66 is shallower in depth than the subcollector 14 and disposed in the collector region 18 at a depth between the subcollector 14 and layer 22. The emitter window 54 self-aligns the implanted ions 74 with the desired location for the collector section 68 in the collector region 18. After ion implantation, the ion-implantation mask 72 is removed by, for example, oxygen plasma ashing or solvent stripping.

To form the collector sections 66, 68, the species for the ions 67, 74 is chosen to dope the semiconductor material of the semiconductor layer 10 with the same conductivity type as the doping of the subcollector 14. The implanted dopant species may be activated by a subsequent rapid thermal anneal. In a representative embodiment, the collector sections 66, 68 may be comprised of n-type semiconductor material formed by implanting an electrically-active n-type dopant, such as an impurity species from Group V of the Periodic Table (e.g., As, P, or Sb) effective to impart n-type conductivity. Alternatively, the collector sections 66, 68 may be comprised of p-type semiconductor material formed by implanting an electrically-active dopant, such as a p-type impurity species from Group III of the Periodic Table (e.g., B, Al, or Ga) effective to impart p-type conductivity. Each of the collector sections 66, 68 can be formed with multiple implantations at different kinetic energies/doses, as opposed to a single implantation.

With reference to FIGS. 7, 7A in which like reference numerals refer to like features in FIG. 6 and at a subsequent fabrication stage, emitters 58, 60 of the device structure 65 are then formed by depositing a layer comprised of a heavily-doped semiconductor material and then patterning the layer with a lithography and etching process. For example, the emitters 58, 60 may be formed from polysilicon heavily doped with a concentration of a dopant, such as an n-type impurity species from Group V of the Periodic Table (e.g., As, P, or Sb) effective to impart n-type conductivity. Alternatively, the emitters 58, 60 may be comprised of p-type semiconductor material formed by implanting an electrically-active p-type dopant, such as a p-type impurity species from Group III of the Periodic Table (e.g., B, Al, or Ga) effective to impart p-type conductivity. An optional layer (not shown) of a dielectric material, such as $Si_3N_4$, may be applied before the emitters 58, 60 are patterned. Each of the emitters 58, 60 fills one of the emitter windows 52, 54 and is directly connected with layer 22. In the representative embodiment, each of the emitters 58, 60 is T-shaped with a head that overlaps with and projects above the level of the surrounding insulating layer 50.

The layers 22, 46, 50 are patterned using conventional photolithography and etching processes to laterally define an intrinsic base 62 of the device structure 65 from the residual portion of layers 22 and an extrinsic base 64 of the device structure 65 from the residual portions of layer 46. The extrinsic base 64 extends laterally of the head of the emitters 58, 60 to permit access for establishing contact with the intrinsic base 62. The spacers 53, 55 and residual portions of layer 32 ensure that the emitters 58, 60 are not shorted to the extrinsic base 64.

The device structure 65 includes a high performance (HP) NPN device 76 with a vertical architecture in which the intrinsic base 62 is located between the emitter 58 and the collector section 66. The device structure 65 also includes a high breakdown (HB) NPN device 78 characterized by a vertical architecture in which the intrinsic base 62 is located between the emitter 60 and the collector section 68.

The geometry (length, $L_1$, and width, $W_1$) of the emitter window 52 operates to localize the collector section 66 in the collector region 18 and to determine the dimensions of the emitter 58 and the p-n junction over which the emitter 58 contacts the intrinsic base 62. Similarly, the geometry (length, $L_2$, and width, $W_2$) of the emitter window 54 operates to localize the collector section 68 in the collector region 18 and to determine the dimensions of the emitter 60 and the p-n junction over which the emitter 60 contacts the intrinsic base 62. The emitters 58, 60 are arranged such that the lengths $L_1$, $L_2$ have a parallel alignment.

Figure 8:
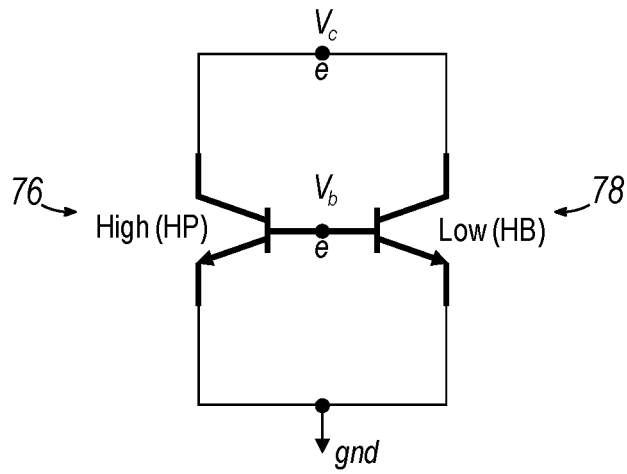
FIG. 8 is a diagrammatic schematic illustrating the electrical configuration of the device structure in FIGS. 7, 7A.

The device structure 65 is a hybridized device structure in which the HP NPN device 76 and the HB NPN device 78 are electrically connected in a parallel circuit arrangement, as shown in FIG. 8. The parallel circuit arrangement operates to broaden the response curve of cut-off frequency as a function of collector current, as will be further discussed hereinbelow. The electrical connections may be supplied at the local interconnect (CA) level such that the collector region 18, emitters 58, 60, and extrinsic base 64 are electrically coupled to other parts of the integrated circuit.

The device structure 65 can be realized with standard elements (e.g., NPN bipolar transistors) from the bipolar design kit. The device structure 65 may be particularly useful in power amplifiers.

In the hybridized device structure 65, the HP NPN device 76 includes a single emitter finger defined by emitter 58 and the HB NPN device 78 includes a single emitter finger defined by emitter 60. However, the HP NPN device 76 may be configured with an array of multiple emitter fingers like emitter 58 in a parallel circuit connection, and/or the HB NPN device 78 may be configured with an array of multiple emitter fingers like emitter 60 in a parallel circuit connection. The additional emitters are formed in substantially the same manner as emitters 58, 60. Each of the additional emitters like emitter 58 for the HP NPN device 76 will include a collector section similar to collector section 66 and each of the additional emitters like emitter 60 for the HB NPN device 78 will include a collector section similar to collector section 68. As discussed elsewhere herein, the geometries of the additional emitters and/or the collector doping concentrations for the additional collector sections can be adjusted to tailor the response curve. Extending the number of emitter fingers supplied an additional degree of freedom, in addition to geometry and collector doping concentration, for achieving flat response curves. The adjustments to the geometry and/or the collector doping concentration can be made to individual fingers of the HP NPN device 76, individual fingers of the HB NPN device 78, to groups of fingers of the HP NPN device 76 so that multiple fingers have nominally identical geometry and/or nominally identical collector doping concentration, or to groups of fingers of the HB NPN device 78 so that multiple fingers have nominally identical geometry and/or nominally identical collector doping concentration.

The insulating layer 50 may be subsequently trimmed adjacent to the head of each of the emitters 58, 60 to expose the top surface of the extrinsic base 64. A silicide layer (not shown) can be formed on the exposed top surface of layer 46 that lowers the contact resistance between layer 46 used to form the extrinsic base and a later-formed overlying conductive via (not shown) that lands on the layer 46.

The conductivity types of the semiconductor materials constituting the emitters 58, 60 and extrinsic base 64 are opposite. The semiconductor material of the extrinsic base 64, which may be a SiGe alloy doped with boron and/or carbon, may have a narrower band gap than the materials (e.g., silicon) of the emitter 58 and collector sections 66, 68, in which case the device structure 65 has a Si/SiGe heterojunction.

During the front-end-of-line (FEOL) portion of the fabrication process, the device structure of the device structure 65 is replicated across at least a portion of the surface area of the semiconductor layer 10. In BiCMOS integrated circuits, complementary metal-oxide-semiconductor (CMOS) transistors (not shown) are formed using other regions of the semiconductor layer 10. As a result, both bipolar and CMOS transistors available on the same semiconductor layer 10.

Standard back-end-of-line (BEOL) processing follows, which includes formation of contacts and wiring for the local interconnect structure, and formation of dielectric layers, via plugs, and wiring for an interconnect structure coupled by the local interconnect wiring with the device structure 65, as well as other similar contacts for additional device structures like device structure 65 and CMOS transistors (not shown) included in other circuitry fabricated on the semiconductor layer 10. Other passive circuit elements, such as resistors, capacitors, varactors, and inductors, may be fabricated on semiconductor layer 10 and available for use in the BiCMOS integrated circuit.

Figure 9:
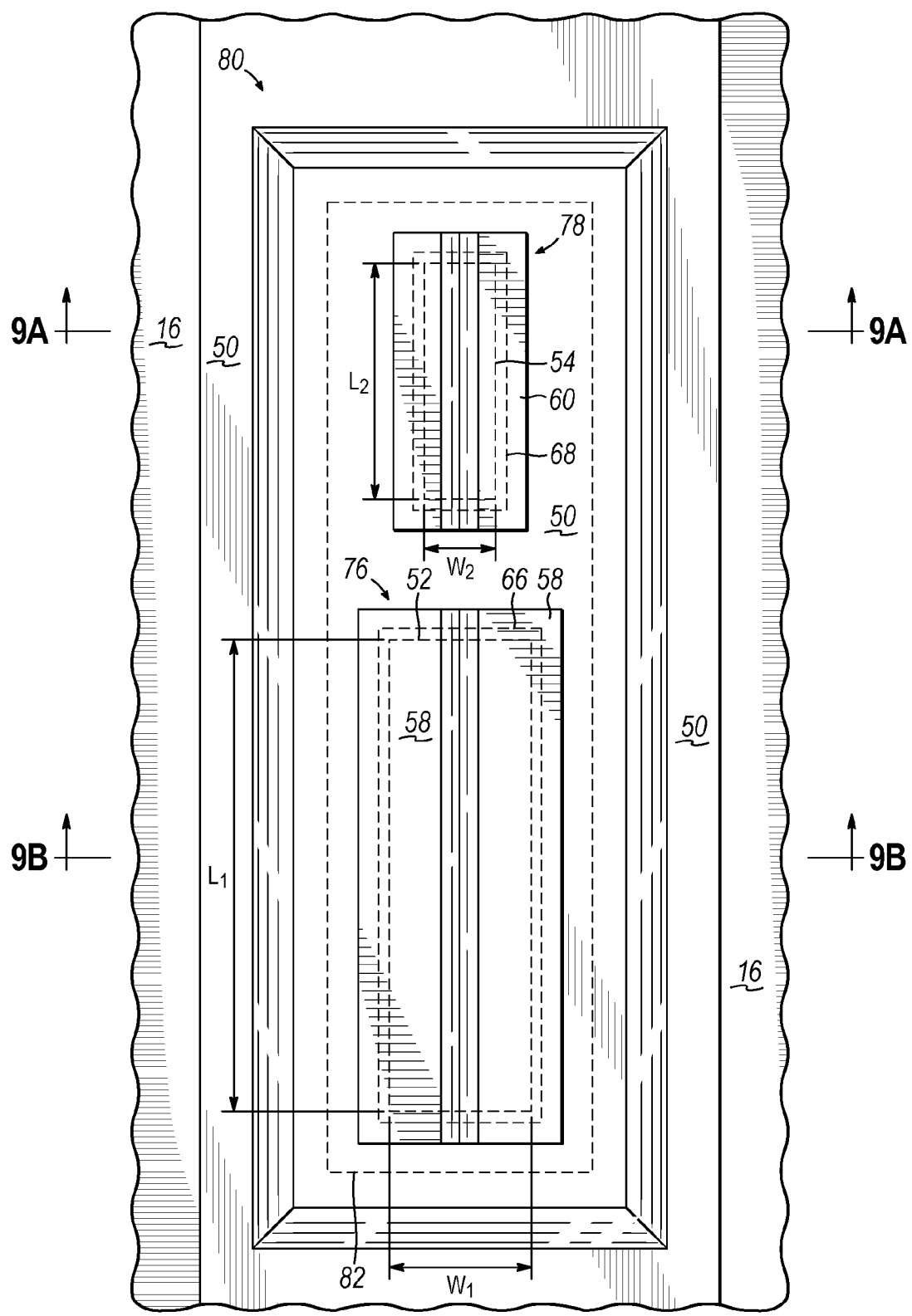
FIG. 9 is a top view similar to FIG. 7A of a device structure in accordance with an alternative embodiment of the invention.
Figure 9A:
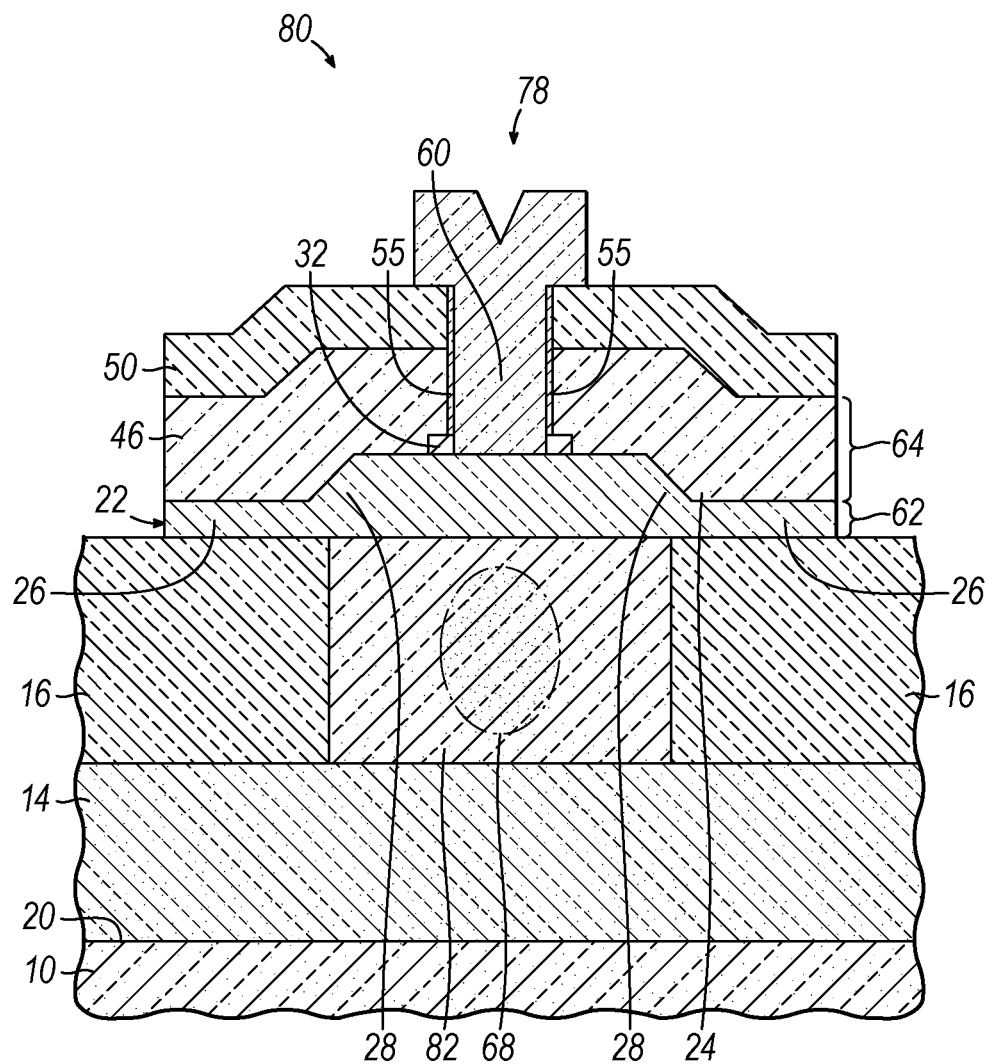
FIG. 9A is a cross-sectional view taken generally along line 9A-9A in FIG. 9.
Figure 9B:
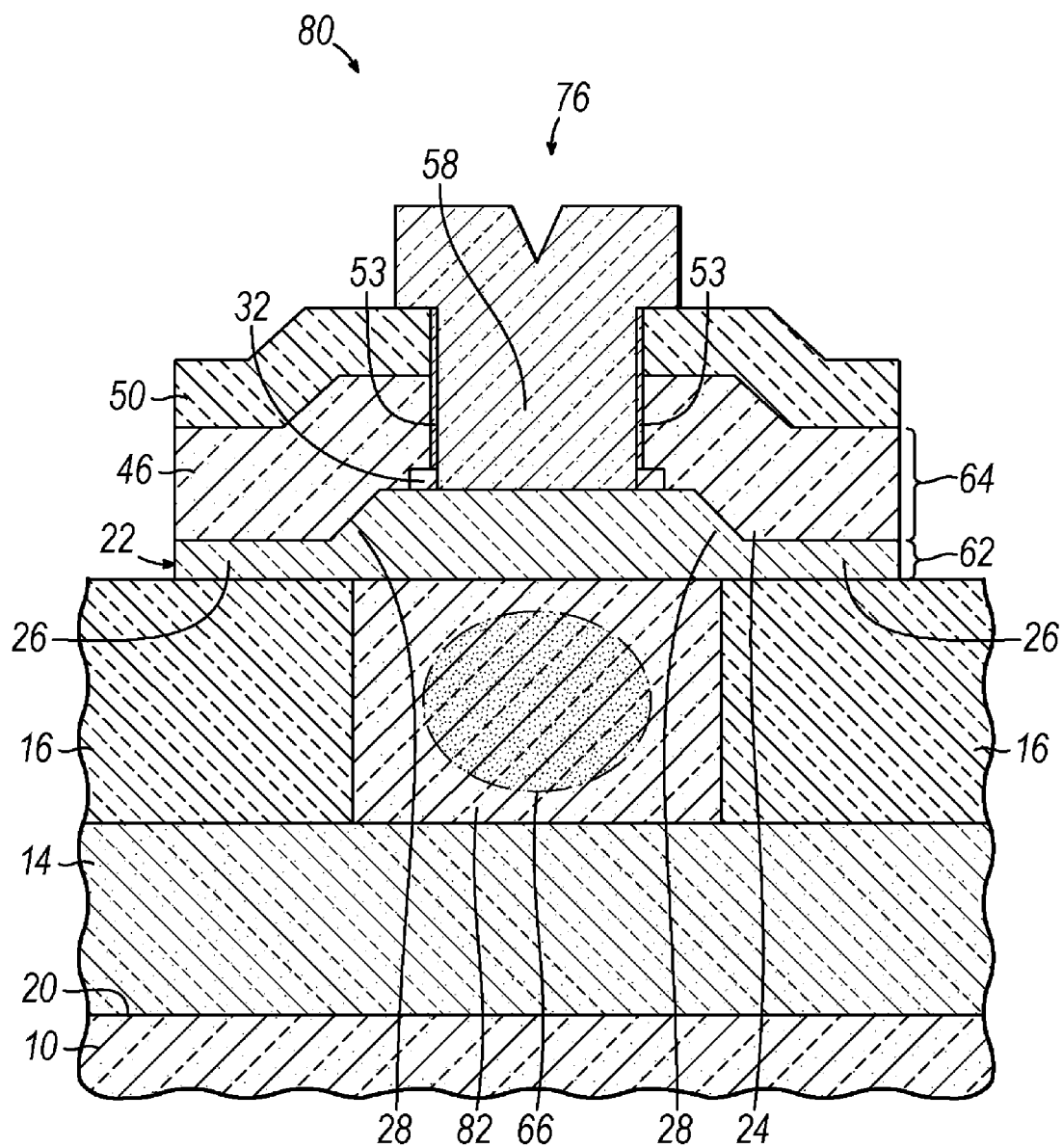
FIG. 9B is a cross-sectional view taken generally along line 9B-9B in FIG. 9.

With reference to FIGS. 9, 9A, and 9B in which like reference numerals refer to like features in FIGS. 7, 7A and in accordance with an alternative embodiment, a device structure 80 includes the HP NPN device 76 and HB NPN device 78, but has been modified to include a collector region 82 for the NPN devices 76, 78 that has a different shape than the collector region 18. Similar to device structure 65 (FIGS. 7, 7A), the device structure 80 includes the intrinsic base 62, the extrinsic base 64, and the different types of collector sections 66, 68, and the emitter 58, intrinsic base 62, and the collector sections 66, 68 have a vertical arrangement. The HP NPN device 76 has a higher cut-off frequency because the collector section 66 has a higher electrical conductivity than the collector section 68 of the HB NPN device 78.

In the representative embodiment, the width, $W_1$, of the emitter window 52 for the HP NPN device 76 is larger than the width, $W_2$, of the emitter window 54 for the HB NPN device 78, and the length, $L_1$, of the HP NPN device 76 is larger than the length, $L_2$, of the HB NPN device 78. In a specific embodiment, the width, $W_1$, of the emitter window 52 for the HP NPN device 76 may be twice as large as the width, $W_2$, of the emitter window 54 for the HB NPN device 78, and the length, $L_1$, of the emitter window 52 for the HP NPN device 76 may be five times as large as the length, $L_2$, of the emitter window 54 for the HB NPN device 78. As a numerical example, the width, $W_1$, of the emitter window 52 for the HP NPN device 76 may be 0.48 μm, the width, $W_2$, of the emitter window 54 for the HB NPN device 78, may be 0.24 μm, the length, $L_1$, of the emitter window 52 for the HP NPN device 76 may be 10 μm, and the length, $L_2$, of the emitter window 54 for the HB NPN device 78 may be 2 μm.

The reconfiguration of the collector region 82 provides a more compact construction because the NPN devices 76, 78 are stacked vertically rather than side-by-side. Specifically, the HP NPN device 76 and HB NPN device 78 have an end-to-end arrangement with the long dimensions ($L_1$, $L_2$) are aligned relative to each other instead of the side-by-side arrangement in which the short dimensions ($W_1$, $W_2$) are aligned relative to each other. The emitters 58, 60 may be positioned in the end-to-end arrangement such that the lengths $L_1$, $L_2$ have a collinear alignment.

Figure 10:
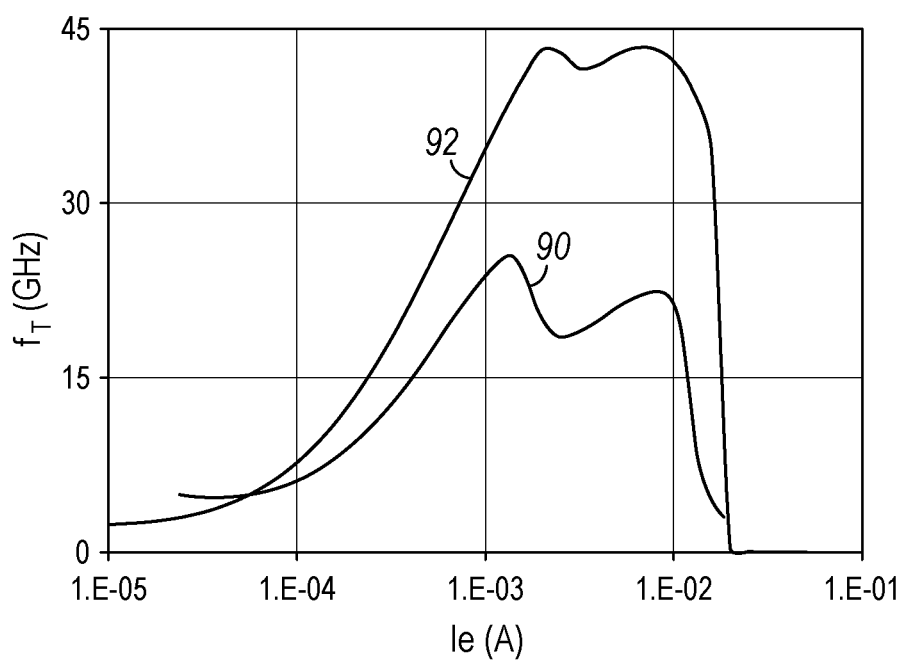
FIG. 10 is a graphical view of cut-off frequency as a function of collector current for a device structure in accordance with embodiments of the invention.

With reference to FIG. 10, response curves 90, 92 of cut-off frequency as a function of drive current or collector current are displayed for the device structures 65, 80 of FIGS. 7, 7A and FIGS. 9, 9A, 9B. The response curves 90, 92 of the device structures 65, 80 can be broadened by tailoring the intrinsic collector resistance of 76 relative to 78, which is accomplished by increasing/decreasing the conductivity through the activated dopant concentration in the collector sections 66, 68. Because the collector section 66 has a higher dopant concentration than the collector section 68, the cut-off frequency for the HP NPN device 76 is intrinsically higher than the response curve for the HB NPN device 78.

As mentioned above, the HP NPN device 76 and HB NPN device 78 are connected together in parallel circuit arrangement as depicted in FIG. 8. The HP NPN device 76 has a higher cut-off frequency ($f_T$) primarily because the collector section 66 of higher relative dopant dose has a higher electrical conductivity than the collector section 68 of the HB NPN device 78. The cut-off frequency may be defined as the frequency at which current gain falls to unity. The difference in cut-off frequency between the NPN devices 76, 78 results in a broadened response curve of cut-off frequency as a function of collector current.

When the device geometries are selected such that emitter windows 52, 54 may have equal lengths $L_1$, $L_2$ and widths $W_1$, $W_2$, the HP NPN device 76 and HB NPN device 78 may exhibit multiple peaks in their characteristics of cut-off frequency versus current drive as apparent in response curve 90. The geometries of the HP NPN device 76 and HB NPN device 78 in the device structures 65, 80 may be tailored to shift the individual response curves such that, when the individual response curves are superimposed, the composite response curve 92 is flattened. The flattening or near-flattening of the response curve 92 may be accomplished by optimizing the geometry of the HB NPN device 78 with respect to the geometry of HP NPN device 76. For example, the HB NPN device 78 may be considerably smaller than the geometry of the HP NPN device 76. In particular, the flattening of the response curve 92 may be achieved by building the HP NPN device 76 with the emitter window 52 longer and/or wider than the emitter window 54. The flattening of the response curve may be influenced to a greater extent by the selection of the relative widths of the NPN devices 76, 78 than a selection of the relative lengths of the NPN devices 76, 78. The response curve 92 exhibits an approximately constant gain around the peak cut-off frequency, $f_T$.

In the representative embodiment, the length, $L_1$, of the emitter window 52 is longer than the length, $L_2$, of the emitter window 54, and the width, $W_1$, of the emitter window 52 is wider than the width, $W_2$, of the emitter window 54. In an alternative embodiment, the emitter windows 52, 54 may have identical widths $W_1$, $W_2$, but different lengths $L_1$, $L_2$. In another alternative embodiment, the emitter windows 52, 54 may have identical lengths $L_1$, $L_2$, but different widths $W_1$, $W_2$.

Figure 11:
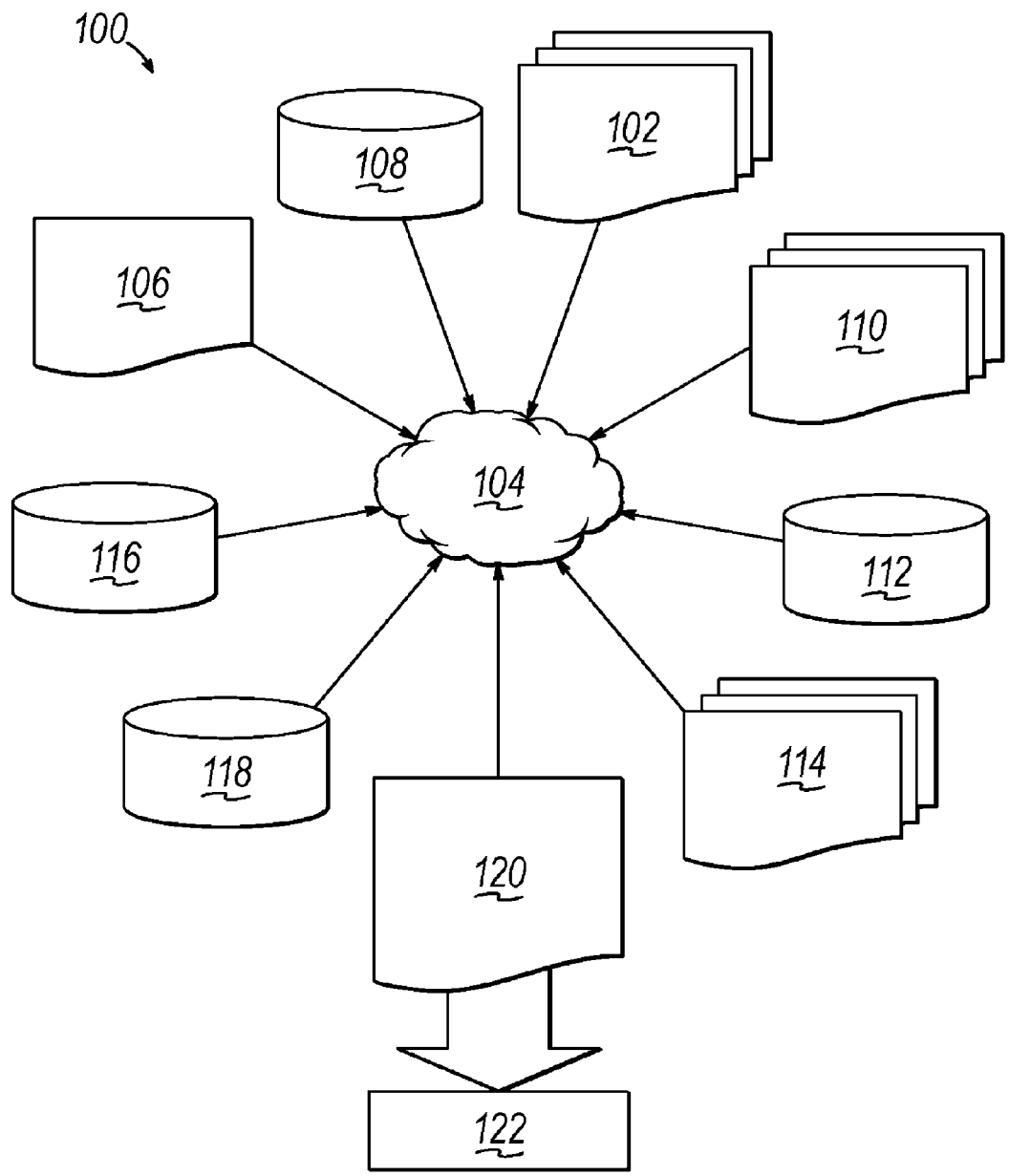
FIG. 11 is a flow diagram of a design process used in semiconductor design, manufacture, and/or test.

FIG. 11 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 7, 7A and FIGS. 9, 9A, 9B. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 7, 7A and FIGS. 9, 9A, 9B. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 7, 7A and FIGS. 9, 9A, 9B to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 7, 7A and FIGS. 9, 9A, 9B. In one embodiment, design structure 120 may comprise a compiled, executable HDL simulation model that functionally simulates the devices shown in FIGS. 7, 7A and FIGS. 9, 9A, 9B.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 7, 7A and FIGS. 9, 9A, 9B. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for fabricating a device structure, the method comprising:
    implanting a semiconductor layer to form a first section of a collector region with a first dopant concentration;
    implanting the semiconductor layer to form a second section of the collector region with a second dopant concentration higher than the first dopant concentration;
    forming a first emitter in vertical alignment with the first section of the collector region; and
    forming a second emitter in vertical alignment with the second section of the collector region.

2. The method of claim 1 further comprising:
    selecting a width of the first emitter and the first section of the collector to be different than a width of the second emitter and the second section of the collector region.

3. The method of claim 1 further comprising:
    selecting a length of the first emitter and the first section of the collector to be different than a length of the second emitter and the second section of the collector region.

4. The method of claim 1 further comprising:
    adjusting a width and a length of the first and second emitters and the first and second sections of the collector region to tailor a response curve of cut-off frequency as a function of collector current.

5. The method of claim 1 wherein the collector region includes a third section with a third dopant concentration, and further comprising:
    forming a third emitter in vertical alignment with the third section of the collector region.

6. The method of claim 1 wherein the first section of the collector region and the second section of the collector region have a juxtaposed arrangement within the collector region.

7. The method of claim 1 wherein the collector region is formed beneath a top surface of a substrate, and further comprising:
    forming a first layer for an intrinsic base on the top surface of the substrate;
    forming a second layer for an extrinsic base on the first layer; and
    forming a first opening that extends through the first layer and the second layer to the top surface,
    wherein the first section of the collector region is implanted through the first opening, and the first emitter is positioned in the first opening.

8. The method of claim 7 further comprising:
    forming a second opening that extends through the first layer and the second layer to the top surface,
    wherein the second section of the collector region is implanted through the second opening, and the second emitter is positioned in the second opening.

9. The method of claim 1 wherein the second dopant concentration is at least an order of magnitude higher than the first dopant concentration.

10. The method of claim 1 wherein the first emitter has a first length and the second emitter has a second length, and the first emitter and second emitter are arranged such that the first length is aligned parallel to the second length.

11. The method of claim 1 wherein the first emitter has a first length and the second emitter has a second length, and the first emitter and second emitter are arranged such that the first length is aligned collinear with the second length.

12. The method of claim 1 wherein the collector region is formed beneath a top surface of a substrate, and further comprising:
    forming a layer for an intrinsic base on the top surface of the substrate; and
    forming a first opening that extends through the layer to the top surface,
    wherein the first section of the collector region is implanted through the first opening, and the first emitter is positioned in the first opening.

13. The method of claim 12 further comprising:
    forming a second opening that extends through the layer to the top surface,
    wherein the second section of the collector region is implanted through the second opening, and the second emitter is positioned in the second opening.

14. The method of claim 12 further comprising:
    before implanting the first section of the collector region through the first opening, forming spacers inside the first opening.

15. The method of claim 7 further comprising:
    before implanting the first section of the collector region through the first opening, forming spacers inside the first opening.

16. The method of claim 1 further comprising:
    forming a third emitter in vertical alignment with the first section of the collector region.

17. The method of claim 1 further comprising:
    forming a third emitter in vertical alignment with the second section of the collector region.

* * * * *